United States Patent
Chang et al.

(10) Patent No.: US 6,594,875 B2
(45) Date of Patent: Jul. 22, 2003

(54) METHOD FOR PRODUCING A PIEZOELECTRIC/ELECTROSTRICTIVE ACTUATOR

(75) Inventors: Kwang Kyun Chang, Kyungki-Do (KR); Sang Kyeong Yun, Kyungki-Do (KR); Dong-Hoon Kim, Kyungki-Do (KR)

(73) Assignee: Samsung Electro-Mechanics Co., Suwon (KR)

( * ) Notice: Subject to any disclaimer, the term of this patent is extended or adjusted under 35 U.S.C. 154(b) by 135 days.

(21) Appl. No.: 09/776,652

(22) Filed: Feb. 5, 2001

(65) Prior Publication Data

US 2001/0009345 A1 Jul. 26, 2001

Related U.S. Application Data (62) Division of application No. 09/332,688, filed on Jun. 14, 1999.
(60) Provisional application No. 60/104,235, filed on Oct. 14, 1998.

(30) Foreign Application Priority Data

Oct. 14, 1998 (KR) ............................................. 98-42912
Feb. 8, 1999 (KR) .............................................. 99-4286

(51) Int. Cl.[7] ............................................. H04R 17/00
(52) U.S. Cl. ......................... 29/25.35; 29/830; 29/846; 29/831; 310/358; 310/363
(58) Field of Search ................................ 29/25.35, 830, 29/846, 831; 156/89.12, 89.14, 89.16; 264/621, 614–620; 427/372.2, 377, 380, 419.3; 310/358, 363

(56) References Cited

U.S. PATENT DOCUMENTS

| 4,829,033 A | * | 5/1989 | Menashi et al. ............. 423/598 |
| 5,126,615 A | | 6/1992 | Takeuchi et al. ............ 310/330 |
| 5,210,455 A | | 5/1993 | Takeuchi et al. ............ 310/328 |
| 5,296,189 A | * | 3/1994 | Kang et al. ..................... 419/9 |
| 5,320,910 A | | 6/1994 | Banno et al. ................ 310/358 |
| 5,376,856 A | | 12/1994 | Takeuchi et al. ............ 310/328 |
| 5,600,197 A | | 2/1997 | Takeuchi et al. ............ 310/328 |
| 5,691,752 A | | 11/1997 | Moynihan et al. .......... 310/358 |
| 5,719,607 A | * | 2/1998 | Hasegawa et al. ............ 216/27 |
| 5,774,961 A | * | 7/1998 | Takeuchi et al. ........... 29/25.35 |
| 5,802,686 A | * | 9/1998 | Shimada et al. ............... 216/27 |
| 5,825,121 A | | 10/1998 | Shimada ..................... 310/358 |
| 5,994,822 A | | 11/1999 | Kondo et al. ............... 310/358 |
| 6,013,970 A | | 1/2000 | Nishiwaki et al. .......... 310/358 |
| 6,051,914 A | | 4/2000 | Nishiwaki et al. .......... 310/358 |
| 6,097,133 A | * | 8/2000 | Shimada et al. ............ 310/328 |
| 6,147,438 A | * | 11/2000 | Nishiwaki et al. .......... 310/363 |

FOREIGN PATENT DOCUMENTS

| GB | 2161647 | 1/1986 |
| JP | 9300609 | 11/1997 |

\* cited by examiner

Primary Examiner—Carl J. Arbes
Assistant Examiner—Tai V Nguyen
(74) Attorney, Agent, or Firm—Ladas & Parry

(57) ABSTRACT

A method for forming a piezoelectric/electrostrictive actuator in which a piezoelectric/electrostrictive file is formed on a vibrating plate or lower electrode by applying a layer of a ceramic paste theron and baking the paste layer at a low temperature in a range below 300° C. to form the film to its final thickness all in one step.

25 Claims, 5 Drawing Sheets

VIBRATING PLATE
(METAL)

FORMING PIEZOELECTRIC ELEMENTS
(100-600°C)

FORMING UPPER ELECTRODES
(100-600°C)

METHOD FOR PRODUCING A PIEZOELECTRIC/ELECTROSTRICTIVE ACTUATOR

This application is a division of Ser. No. 09/332,688, filed Jun. 14, 1999, which claims benefit of U.S. provisional application Ser. No. 60/104,235, filed Oct. 14, 1998.

BACKGROUND OF THE INVENTION

1. Field of the Invention

The present invention relates to a piezoelectric/electrostrictive actuator and a method for fabricating the same, and more particularly to a piezoelectric/electrostrictive actuator including a vibrating plate made of metal, organic compound or ceramic, and a piezoelectric element formed by forming a piezoelectric/electrostrictive film, in the form of a thin or thick film, on the vibrating plate using specific ceramic powder, and thermally treating the piezoelectric/electrostrictive film at a relatively low temperature, thereby causing the piezoelectric/electrostrictive film to be integral with the vibrating plate, so that the fabrication of the piezoelectric element can be achieved without using a third material for bonding the piezoelectric element to the vibrating plate while minimizing a degradation in the properties of the vibrating plate and being capable of patterning the piezoelectric element during the formation of the piezoelectric element, thereby enabling a simultaneous fabrication of a plurality of piezoelectric/electrostrictive actuators without any requirement of post treatments. The present invention also relates to a method for fabricating such a piezoelectric/electrostrictive actuator.

2. Description of the Prior Art

Generally, actuators include a vibrating plate, a lower electrode formed on the vibrating plate, a piezoelectric/electrostrictive film formed on the lower electrode, and an upper electrode formed over the piezoelectric/electrostrictive film.

In such actuators having the above mentioned configuration, the piezoelectric/electrostrictive film arranged between the upper and lower electrodes deforms repeatedly as voltage is intermittently applied between the upper and low electrodes, so that it vibrates.

Conventionally, ceramic powder produced by solid state reaction method has been used to form piezoelectric/electrostrictive films for piezoelectric elements in piezoelectric/electrostrictive actuators.

The solid state reaction method, which is also called a "mixed oxide method", is a method for producing ceramic powder using an oxide or molten salt as a raw material. In such a solid state reaction method, raw materials in the form of powder are mixed together and then subjected to a thermal treatment at a temperature of 1,000 to 1,200° C. The resulting mixture is milled and then sintered, thereby producing ceramic powder.

Typically, ceramic powder produced by the solid state reaction method has a relatively large grain size of 0.2 to 2 $\mu$m, even though depending on the grain size of raw materials used. For this reason, the solid state reaction method is unsuitable to obtain a grain size of 0.1 $\mu$m. Furthermore, the solid state reaction method has a drawback in that it involves a heat treatment at a high temperature of 1,000° C. or more.

In the fabrication of various film devices using ceramics, a method has conventionally been used in which ceramic paste is produced from ceramic powder, and then subjected to a thermal treatment in a state printed or molded on a vibrating plate.

In conventional ceramic paste preparation methods, a mixture is prepared which consists of a binder, a vehicle, a plasticizer, and a dispersant. The mixture is dissolved in a solvent, thereby producing a solution. Ceramic grains, which are prepared by a solid state reaction method to have a mean grain size of 1 $\mu$m, are then added to the solution. The resulting mixture is then stirred.

In order to fabricate a piezoelectric/electrostrictive film, the ceramic paste prepared by the above mentioned method is printed on a vibrating plate, dried at 130° C., and then subjected to a heat treatment at 1,000° C. or more. However, this method involves a problem in that an additional thermal treatment at a temperature of 500° C. or more should be carried out after the drying process in order to achieve a binder removal for completely removing the organic ingredients added prior to the thermal treatment.

The ceramic paste, which is produced by this method, cannot be formed into a desired shape at a low temperature because it contains ceramic grains of a large size. For this reason, the thermal treatment is carried out at a temperature of 1,000° C. However, this results in a limited selection of usable vibrating plates.

Conventional methods for fabricating piezoelectric/electrostrictive actuators are mainly classified into those associated with a vibrating plate made of metal or organic compound, and those associated with a vibrating plate made of ceramic.

First, conventional methods associated with a vibrating plate made of metal or organic compound will be described.

Figure 1:
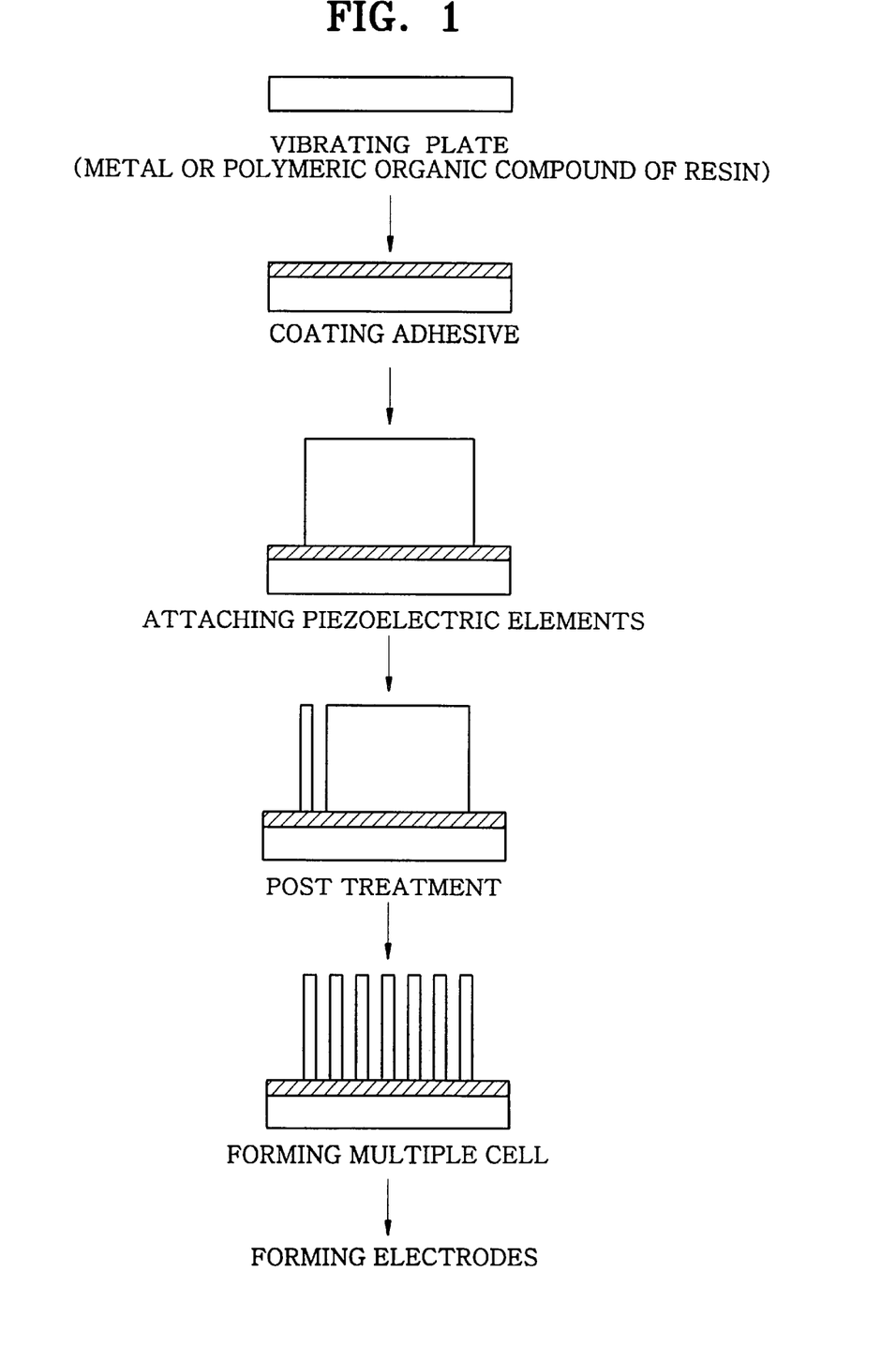
FIG. 1 is a schematic view illustrating a convention method for fabricating a piezoelectric/electrostrictive actuator in association with the case in which a vibrating plate is made of organic compound.

An example of a method for fabricating a piezoelectric/electrostrictive actuator, which is associated with a vibrating plate made of an insulating organic compound of resin, is disclosed in Japanese Patent Laid-open Publication No. Heisei 9-300609.

Where a vibrating plate made of metal or organic compound is used, a degradation in the properties thereof occurs inevitably due to a high temperature applied thereto. To this end, a piezoelectric plate, which is to be formed on the vibrating plate, is formed or fabricated separately from the vibrating plate. The piezoelectric plate is then bonded to the vibrating plate by means of a third material. The resulting structure is then mechanically cut into a desired size, so as to obtain a desired number of piezoelectric/electrostrictive actuators. This process is illustrated in FIG. 1.

This method is advantageous in that there is no requirement to use any process involving difficulties because the vibrating plate is made of resin or metal.

However, there is a problem caused by the use of the third material as a binder to bond the vibrating plate and piezoelectric element together. A binder layer having a non-uniform thickness may be formed in the binding process. Air bubbles may also exist in the binder layer. As a result, it is difficult to form a reliable binder layer.

In order to obtain a desired number of piezoelectric/electrostrictive actuators, the piezoelectric plate is sliced by a mechanical machining process. However, there is a limitation in the integration degree of piezoelectric/electrostrictive actuators due to a limitation on the mechanical machining process. As a result, it is difficult to obtain products exhibiting a superior quality and a high productivity.

Where a vibrating plate made of metal is used, an electric discharge phenomenon may occur because the distance between the upper or lower electrode and the vibrating plate is very short, namely, about 30 $\mu$m.

Next, conventional methods associated with a vibrating plate made of ceramic will be described.

Figure 2:
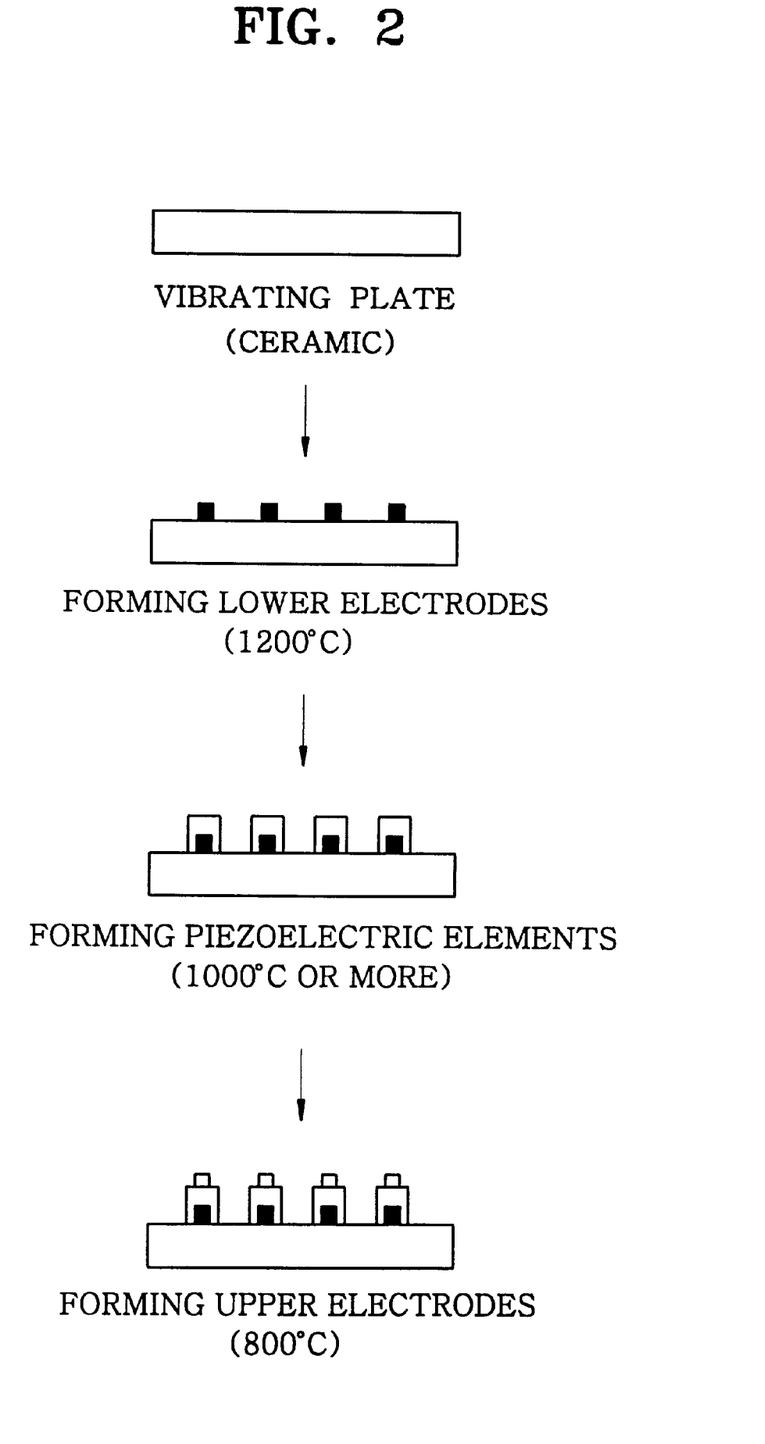
FIG. 2 is a schematic view illustrating a convention method for fabricating a piezoelectric/electrostrictive actuator in association with the case in which a vibrating plate is made of ceramic.
Figure 3:
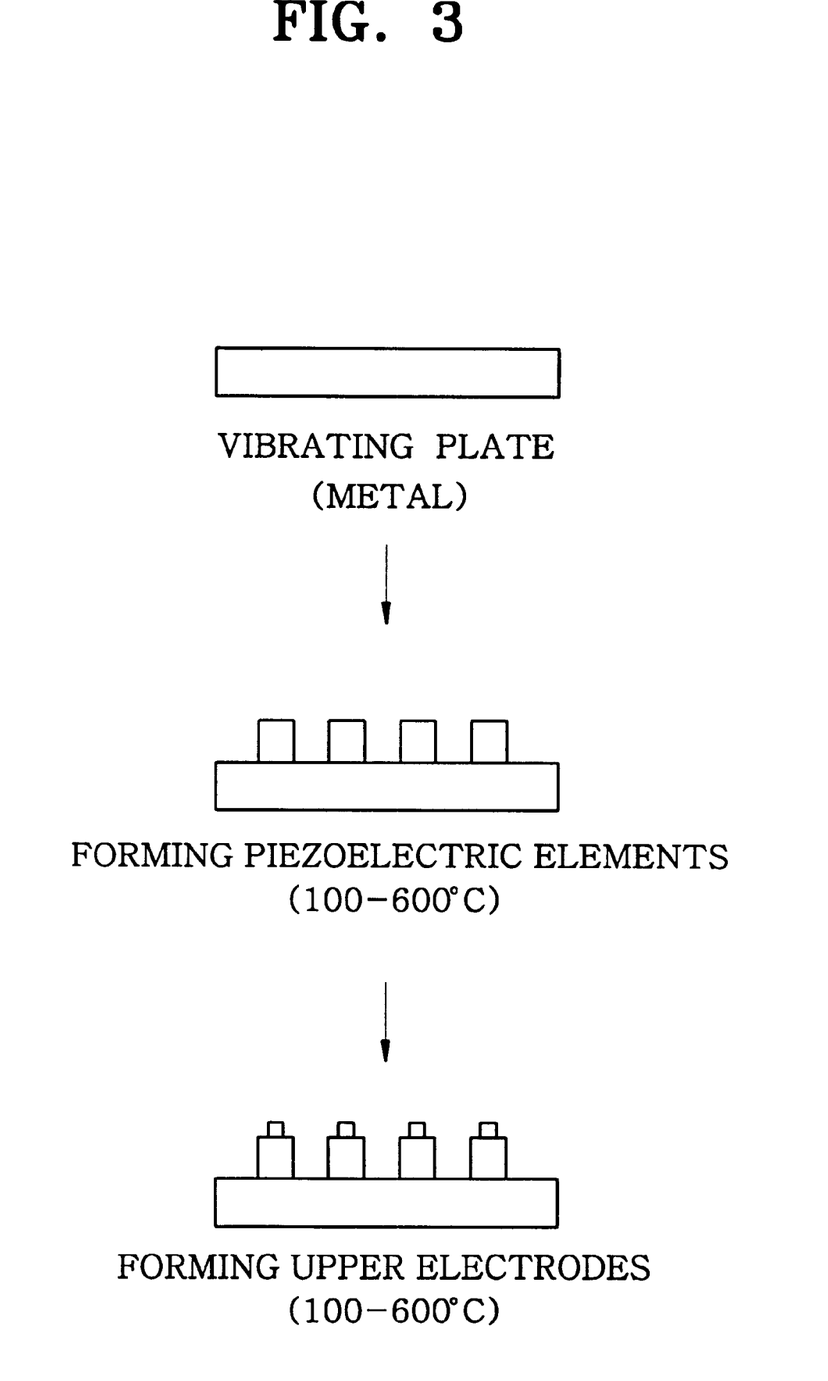
FIG. 3 is a flow chart illustrating a method for fabricating a piezoelectric/electrostrictive actuator, in the present invention, in association with the case in which a vibrating plate is made of metal.

An example of a method for fabricating a piezoelectric/electrostrictive actuator, which is associated with a vibrating plate made of ceramic, is disclosed in U.S. Pat. No. 5,430,344. Where a thin or thick film for a piezoelectric element is directly formed over a vibrating plate, a degradation in the properties of the vibrating plate may occur during a sintering process carried out for the film at a high temperature. To this end, ceramic, which can withstand the sintering temperature for the piezoelectric element, is used to form a vibrating plate.

Where such ceramic vibrating plate is used, a lower electrode is formed on the ceramic vibrating plate using a thermal treatment at a temperature of 1,200° C. or more. A piezoelectric element is then formed over the lower electrode using a thermal treatment at a temperature of 1,000° C. or more. Finally, an upper electrode is formed over the piezoelectric element at a temperature of about 800° C. This process is illustrated in FIG. 2.

A representative ceramic material used for the vibrating plate is a stabilized zirconia ($ZrO_2$). Pure zirconia, which does not contain any addition ingredient, cannot be used for the vibrating plate because it involves a self collapse phenomenon occurring in the vicinity of 1,000° C.

Although zirconia exhibits most superior mechanical properties in that no oxidation or variation thereof occurs even at a high temperature of 1,200° C., there is a difficulty in shaping.

A vibrating plate made of zirconia is fabricated using a tape casting process. In the tape casting process, a blade is arranged over a film in such a fashion that a gap corresponding to a desired thickness of a zirconia film, to be formed, is defined between the blade and the film. A zirconia slurry is then coated to a desired thickness over the film while moving the film, thereby forming a zirconia film. The resulting structure is then cured at room temperature. Thereafter, the zirconia film is removed from the structure, thereby obtaining a vibrating plate having a desired thickness.

This method is advantageous in that it is possible to fabrication ultra-thin film type ceramic piezoelectric/electrostrictive actuators using a high temperature integral formation process such as ceramic micro formation process.

However, this method requires a structural shaping process, taking into consideration the shrinkage of the vibrating plate and piezoelectric element caused by the integral formation of those vibrating plate and piezoelectric element at a high temperature. Furthermore, since the ceramic vibrating plate has a very small thickness of, for example, 10 $\mu$m, it is very difficult to maintain a desired quality during the formation of a green sheet, and to control a deformation of the vibrating plate during the high temperature formation.

The materials of elements constituting the piezoelectric actuator including the lower electrode material act chemically with one another, so that they may be degraded in properties. To this end, fabrication techniques involving difficulties should be used. For this reason, a degradation in yield occurs.

SUMMARY OF THE INVENTION

Therefore, an object of the invention is to solve the above mentioned problems and to provide a piezoelectric/electrostrictive actuator including a piezoelectric element formed using specific ceramic powder produced by a novel method, so that it is fabricated even at a low temperature, thereby being capable of using a vibrating plate made of various materials, directly forming a piezoelectric/electrostrictive film, as the piezoelectric element, on the vibrating plate without using any bonding process, and thus, achieving an improvement in quality, productivity, and yield, and to provide the piezoelectric/electrostrictive actuator.

In one aspect, the present invention provides a method for a piezoelectric/electrostrictive actuator comprising the steps of: preparing a vibrating plate made of metal; preparing ceramic oxide powder having a grain size of 5 $\mu$m or less and containing lead (Pb) and titanium (Ti) as basic elements thereof, said ceramic oxide powder being produced by a non-explosive oxidative-reductive combustion reaction carried out at a temperature of 100 to 500° C., preparing an organic solvent or water-based ceramic sol solution containing constituent ceramic elements identical or similar to those of said ceramic oxide powder, and mixing said ceramic oxide powder with said ceramic sol solution, thereby producing ceramic paste; forming a piezoelectric/electrostrictive film on said vibrating plate using said ceramic paste; thermally treating the resulting structure obtained after the formation of said piezoelectric/electrostrictive film at a temperature of 100 to 600° C., thereby baking said piezoelectric/electrostrictive film; and forming an upper electrode on said piezoelectric/electrostrictive film.

In another aspect, the present invention provides a piezoelectric/electrostrictive actuator comprising: a vibrating plate made of metal; a piezoelectric/electrostrictive film formed on an upper surface of said vibrating plate by use of ceramic paste produced by preparing ceramic oxide powder having a grain size of 5 $\mu$m or less and containing lead (Pb) and titanium (Ti) as basic elements thereof, said ceramic oxide powder being produced by a non-explosive oxidative-reductive combustion reaction carried out at a temperature of 100 to 500° C., preparing an organic solvent or water-based ceramic sol solution containing constituent ceramic elements identical or similar to those of said ceramic oxide powder, and mixing said ceramic oxide powder with said ceramic sol solution; and an upper electrode coupled to an upper surface of said piezoelectric/electrostrictive film.

In another aspect, the present invention provides a method for a piezoelectric/electrostrictive actuator comprising the steps of: preparing a vibrating plate; forming a lower electrode on said vibrating plate; preparing ceramic oxide powder having a grain size of 5 $\mu$m or less and containing lead (Pb) and titanium (Ti) as basic elements thereof, said ceramic oxide powder being produced by a non-explosive oxidative-reductive combustion reaction carried out at a temperature of 100 to 500° C., preparing an organic solvent or water-based ceramic sol solution containing constituent ceramic elements identical or similar to those of said ceramic oxide powder, and mixing said ceramic oxide powder with said ceramic sol solution, thereby producing ceramic paste; forming a piezoelectric/electrostrictive film on said lower electrode using said ceramic paste; thermally treating the resulting structure obtained after the formation of said piezoelectric/electrostrictive film at a temperature of 100 to 600° C., thereby baking said piezoelectric/electrostrictive film; and forming an upper electrode on said piezoelectric/electrostrictive film.

In another aspect, the present invention provides a piezoelectric/electrostrictive actuator comprising: a vibrating plate; a lower electrode coupled to an upper surface of said vibrating plate; a piezoelectric/electrostrictive film formed on an upper surface of said lower electrode by use of ceramic paste produced by preparing ceramic oxide powder having a grain size of 5 μm or less and containing lead (Pb) and titanium (Ti) as basic elements thereof, said ceramic oxide powder being produced by a non-explosive oxidative-reductive combustion reaction carried out at a temperature of 100 to 500° C., preparing an organic solvent or water-based ceramic sol solution containing constituent ceramic elements identical or similar to those of said ceramic oxide powder, and mixing said ceramic oxide powder with said ceramic sol solution; and an upper electrode coupled to an upper surface of said piezoelectric/electrostrictive film.

BRIEF DESCRIPTION OF THE DRAWINGS

Other objects and aspects of the invention will become apparent from the following description of embodiments with reference to the accompanying drawings in which.

DETAILED DESCRIPTION

In the present invention, specific ceramic oxide powder is used to form a piezoelectric/electrostrictive film, as a piezoelectric element, on a vibrating plate. This ceramic oxide powder is prepared by a method involving the steps of sufficiently dissolving or uniformly dispersing a raw material of constituent ceramic elements in a solvent or dispersion medium, thereby preparing a solution or dispersed mixture containing constituent ceramic elements, adding citric acid in the solution or dispersed mixture, in which the constituent ceramic elements are dissolved or dispersed, at least in an amount required to generate an oxidative-reductive combustion reaction with anions of the constituent ceramic elements, thereby preparing a mixed solution, and thermally treating the mixed solution at a temperature of 100 to 500° C. In the present invention, the method may further involve the step of additionally thermally treating the resulting product at a temperature of 700 to 900° C., thereby increasing the crystallinity of the product.

The raw material containing constituent ceramic elements is selected from oxides of the constituent ceramic elements, organic and inorganic salts of the constituent ceramic elements such as carbonates and nitrates of the constituent ceramic elements, and complexes of the constituent ceramic elements.

For the constituent ceramic elements, piezoelectric/electrostrictive ceramic elements are preferably used which basically include lead (Pb) and titanium (Ti).

More preferably, the constituent ceramic elements include lead (Pb), zirconium (Zr), and titanium (Ti), or lead (Pb), magnesium (Mg), and niobium (Nb).

The solvent or dispersion medium includes either or both water and an organic solvent capable of dissolving or dispersing the raw material for the constituent ceramic elements. The organic solvent mainly includes dimethyl formamide, methoxyethanol, acetic acid, alcohols, or glycols.

For the combustion aid, citric acid is used which is an organic compound capable of generating a combustion reaction. Although citric acid is used in conventional methods, it does not serve as a combustion aid, but serves as a complexing agent for providing a reaction homogeneity. In particular, such an application of citric acid is made in the Pechini process. A rate-adjusted combustion reaction can be generated by the combustibility and complexing effect of citric acid.

A mixed solution is prepared by adding citric acid to a solvent, dispersed solution, or dispersed mixture, and then mixing them together. The added amount of citric acid is not less than an amount required to generate an oxidative-reductive combustion reaction with anions of the constituent ceramic elements.

The mixed solution added with citric acid is thermally treated at a temperature of 100 to 500° C. Although ceramic phase with an enhanced crystallinity is obtained at a higher thermal treatment temperature, a sufficient combustion reaction can occur even at a temperature of not less than 100° C. A required combustion reaction may occur even at a temperature of more than 100° C. However, heat treatment at such a higher temperature does not provide any effect distinguishable from those obtained in conventional methods.

More preferably, the mixed solution is thermally treated at a temperature of 150 to 300° C. This temperature range is a considerably low temperature range of the thermal treatment while producing ceramic phase with an appropriate crystallinity.

When the mixed solution is heated, the solvent or dispersion medium therein evaporates.

The citric acid is completely removed during the combustion reaction. Ceramic oxide powder is produced without any scattering thereof, by virtue of the heat generated during the combustion reaction of the citric acid.

Since the combustion reaction is carried out for a sufficient time, elements other than the constituent ceramic elements are eliminated. Accordingly, pure ceramic oxide powder containing no impurities is produced.

The ceramic oxide powder produced by the above mentioned method has a micro grain size of 5 μm or less, preferably, 0.5 μm or less and exhibits a uniform grain size distribution. The ceramic oxide powder has primary particles existing in the form of independent substances or soft aggregates. In particular, the ceramic oxide powder exists in a completely fired ceramic phase. Accordingly, the ceramic oxide powder exhibits no reduction in weight even after being subjected to an additional thermal treatment.

The ceramic oxide powder also exhibits a superior surface reaction property, so that it can be formed into a desired shape by use of a thermal treatment at a low temperature. Accordingly, the ceramic oxide powder can be applied to a variety of vibrating plates with a high degree of freedom. By virtue of the ceramic oxide powder, a variety of printing methods can also be used in association with vibrating plates.

In order to increase the crystallinity of the ceramic oxide powder produced as mentioned above, the produced ceramic oxide powder may further be thermally treated at a temperature of 700 to 900° C.

Using the ceramic powder prepared as mentioned above, a piezoelectric/electrostrictive film is formed on a vibrating plate. Since the formation of the piezoelectric/electrostrictive film is carried out at a temperature in the present invention, there is no limitation on the material of the vibrating plate. For the vibrating plate, accordingly, any material may be used in so far as it has a flexibility capable of allowing its bending. For example, metal, ceramic, and organic compounds of resin can be used.

Now, a method for fabricating a piezoelectric/electrostrictive actuator will be described in association with the case in which a vibrating plate is comprised of a metal plate.

Where the vibrating plate is comprised of a metal plate, the metal plate can serve as both the vibrating plate and lower electrode by virtue of a conductivity provided by the metal thereof. In this case, accordingly, it is unnecessary to provide a separate lower electrode.

The metal plate may be made of various alloys well-known in the technical field. Stainless steel (SUS) or nickel is preferred. Preferably, the metal plate has a thickness of 3 to 200 μm.

In the case in which such a metal plate is used for the vibrating plate, the piezoelectric/electrostrictive film is directly formed on the vibrating plate because there is no requirement of any separate lower electrode.

The formation of the piezoelectric/electrostrictive film can be achieved using various methods. A representative method is a method in which a piezoelectric/electrostrictive film is formed using ceramic paste at a low temperature by a printing, molding, or coating method. This method will now be described.

In this method, a raw material for ceramic paste to be produced is prepared by mixing ceramic oxide powder with ceramic sol solution containing dissolved constituent ceramic elements identical or similar to those of the ceramic oxide powder while having an affinity with the ceramic oxide powder.

For the ceramic oxide powder, fine powder is effective when the reaction property of the ceramic oxide powder is taken into consideration. Such a fine powder is also preferred in order to establish a system enabling a shaping at a low temperature. In this regard, the ceramic oxide powder produced in the present invention is preferably used.

Preferably, the ceramic oxide powder basically include lead (Pb) and titanium (Ti). More preferably, the ceramic oxide powder include lead (Pb), zirconium (Zr), and titanium (Ti).

It is more preferable that PZT, PMN or their solid solution (PZT-PMN) complex oxide are used as ceramic oxide powder.

Also the ceramic oxide can further include one or more element among nickel (Ni), lantanum (La), barium (Ba), zinc (Zn), lithium (Li), cobalt (Co), cadmium (Cd), cerium (Ce), chrome (Cr), antimony (Sb), iron (Fe), yttrium (Y), tantalum (Ta), tungsten (W), strontium (Sr), calcium (Ca), bismuth (Bi), tin (Sn), manganese (Mn).

At room temperature, ceramic oxide powder is present in a state bonded with water of at least a monolayer at the surface thereof. The water bonded to the surface of the ceramic oxide powder has influence on the acidity and basicity of the ceramic oxide powder surface. This water serves as a catalyst when the ceramic oxide powder is mixed with the ceramic sol solution.

The ceramic sol solution basically contains an organic solvent or water and is prepared by dissolving constituent ceramic elements in the organic solvent or water. For the organic solvent, which is the base of the ceramic sol solution, a variety of organic solvents may be used. Preferably, the organic solvent is selected from acetic acid, dimethyl formamide, methoxyethanol, alcohols, and glycols.

Preferably, the constituent ceramic elements used to prepare the ceramic sol solution include those containing lead (Pb), zirconium (Zr), titanium (Ti). Preferably, the ceramic sol solution prepared has a concentration of 0.1 to 5M.

Preferably, the content of the ceramic sol solution in a mixture of the ceramic sol solution with the ceramic oxide powder is 1 to 200 weight percent based on the weight of the ceramic oxide powder. Where the content of the ceramic sol solution is more than 200 weight percent, an excessive dilution of the ceramic oxide powder occurs, thereby resulting in a low viscosity of the mixture. On the other hand, where the content of the ceramic sol solution is less than 1 weight percent, the mixture has an excessively high viscosity due to an excessive amount of the ceramic oxide powder.

In the mixture, in which two systems of the ceramic oxide powder and ceramic sol solution exist, the ceramic sol connects particles of the solid phase ceramic oxide powder while being coated over the surface of the ceramic oxide powder, thereby effectively filling voids existing among the particles of the ceramic oxide powder.

In the powder-sol mixture prepared as mentioned above, the ceramic oxide powder, which has intrinsic characteristics for ceramic, is surrounded by the ceramic sol solution containing elements identical or similar to those of the ceramic oxide powder, while having an appropriate flowability. The ceramic sol solution serves as a reaction medium on the surface of the ceramic oxide powder. Accordingly, an improvement in the reaction property of the powder surface is obtained.

When the powder-sol mixture comes into contact with a separate organic substance at a subsequent processing step, the organic ingredients contained in the ceramic sol solution serve to ensure a stability at the contact interface, thereby providing a dispersability and homogeneity.

In such a system, the sol solution is thermally decomposed, so that it is changed into a composition identical or similar to that of the ceramic oxide powder. Thus, ceramic system having an improved connectivity among grains can be obtained even at a low temperature.

A physical property-adjusting organic solvent may be added in order to provide a stability of the mixture between the ceramic oxide powder and ceramic sol solution and a flowability required for the shaping of ceramic paste produced from the mixture. A variety of physical property-adjusting organic solvents may be used. Preferably, the physical property-adjusting organic solvent includes glycols or alcohols which have a greater or less viscosity while exhibiting a low vapor pressure even at room temperature.

Where a physical property-adjusting organic solvent is added to the mixture of the ceramic oxide powder and ceramic sol solution, it is preferred that its amount be 1 to 100 weight percent based on the weight of the ceramic oxide powder. When the amount of the physical property-adjusting organic solvent is less than one weight percent, there is no effect expected by the addition of the physical property-adjusting organic solvent. Where the physical property-adjusting organic solvent is added in an amount of more than 100 weight percent, the mixture is in an excessively diluted state, so that it cannot have a desired viscosity. As a result, a degradation in shapability occurs.

More preferably, the physical property-adjusting organic solvent is added in an amount of 10 to 40 weight percent based on the weight of the ceramic oxide powder. In this range, a desired effect expected by the addition of the physical property-adjusting organic solvent is obtained. The mixture also has an appropriate viscosity.

A small amount of an organic material may also be added to the mixture of the ceramic oxide powder and ceramic sol solution added with the physical property-adjusting organic solvent, in order to provide an improved uniform dispersability and homogeneity to the mixture. Preferably, the organic material includes long-chain alcohols or a polar organic solvent.

For the long-chain alcohols, pentanol and hexanol are preferred. Preferably, the polar organic solvent includes acetylacetone or methoxyethanol.

Preferably, the organic material is added in an amount of 1 to 100 weight percent based on the weight of the ceramic oxide powder. When the amount of the organic material is less than one weight percent, there is no effect expected by the addition of the organic material. Where the organic material is added in an amount of more than 100 weight percent, the mixture is in an excessively diluted state, so that it cannot have a desired viscosity. As a result, a degradation in shapability occurs.

More preferably, the organic material is added in an amount of 10 to 40 weight percent based on the weight of the ceramic oxide powder. In this range, a desired effect expected by the addition of the physical property-adjusting organic solvent is obtained. The mixture also has an appropriate viscosity.

Ceramic paste, which is prepared in the above mentioned method, is applied to a vibrating plate by a printing, molding, or coating method, thereby forming a piezoelectric/electrostrictive film.

The piezoelectric/electrostrictive film is then thermally treated at a temperature of 100 to 600° C. During the thermal treatment, the solvent is also removed. The ceramic sol solution contained in the ceramic paste serves as a reaction medium on the surfaces of the ceramic oxide grains, so that the oxide grains are coupled together. A sufficient reaction occurs even at such a low temperature of 100 to 600° C. This is because the water existing on the surface of the ceramic oxide powder in the powder-sol mixture hydrolyzes the ceramic sol solution, so that the constituent ceramic elements in the ceramic sol solution are released from the ceramic sol solution, and then reacts with the ceramic oxide powder, thereby being bonded to the ceramic oxide powder, as in a calcination. During the thermal treatment, the added organic material is also removed.

More preferably, the piezoelectric/electrostrictive film is thermally treated at a temperature of 150 to 300° C. This temperature range is a considerably low temperature range of the thermal treatment while producing a piezoelectric/electrostrictive film with an appropriate crystallinity and shapability.

Where the printing or molding method is used to form a piezoelectric/electrostrictive film using ceramic paste applied to a vibrating plate, it is possible to adjust the thickness of the piezoelectric/electrostrictive film by adjusting the thickness of a screen or mold. Accordingly, it is possible to freely form a piezoelectric/electrostrictive film having a thickness ranging from that of a thin film to that of a thick film.

Where the coating method is used, a piezoelectric/electrostrictive film can be formed by forming an associated film over the entire upper surface of a vibrating plate, and then carrying out a post finishing process for the film. It is also possible to form a piezoelectric/electrostrictive film with a desired pattern using a masking process. The thickness of the film is adjusted by repeatedly carrying out the processes of forming the film over the vibrating plate and carrying out the thermal treatment until a desired thickness is obtained.

A processing step of drying the ceramic paste applied to the vibrating plate at a temperature of 70 to 150° C. may be additionally carried out prior to the above mentioned thermal treatment.

The piezoelectric/electrostrictive film formed as mentioned above exhibits intrinsic characteristics for ceramic in spite of the fact that it is subjected to a thermal treatment at a low temperature. Moreover, since the thickness of the piezoelectric/electrostrictive film is adjustable, it is possible to form piezoelectric/electrostrictive films ranging in thickness from that of a thin film to that of a thick film.

It is preferable that the thickness of the piezoelectric/electrostrictive film is 1–100 $\mu$m. It is more preferable that the thickness of the piezoelectric/electrostrictive film is 5–30 $\mu$m.

In particular, the ceramic paste can be formed into a film only by use of a thermal treatment at a low temperature. Accordingly, this ceramic paste has a high applicability.

For the formation of the peizoelectric/electrostrictive film, it is unnecessary to add any organic material such as a dispersant to the ceramic paste used. Accordingly, there is no requirement to use any binder removal process carried out at a temperature of 100° C. or more prior to the thermal treatment. Therefore, the formation of the piezoelectric/electrostrictive film can be achieved using a single thermal treatment process at a low temperature.

After the formation of the piezoelectric/electrostrictive film, an upper electrode is formed over the piezoelectric/electrostrictive film.

For the upper electrode, silver (Ag), aluminum (Al), gold (Au), nickel (Ni) or platinum (Pt) may be used. Where the upper electrode is made of silver, silver paste is used which is commercially available and adapted to be subjected to a low temperature treatment. In this case, the silver paste is applied to a vibrating plate and then formed into a desired film using a printing method such as a screen printing or stencil printing method. Where the upper electrode is made of aluminum, gold, nickel or platinum, it is formed using a sputtering, vacuum deposition, or evaporation method.

After the formation of the upper electrode on the piezoelectric/electrostrictive film, the resulting structure is thermally treated at a temperature of 100 to 600°, preferably, 150 to 300° C., so that the upper electrode is bonded to the piezoelectric/electrostrictive film. Such a thermal treatment is unnecessary in the case in which aluminum or gold is used for the upper electrode.

Figure 4:
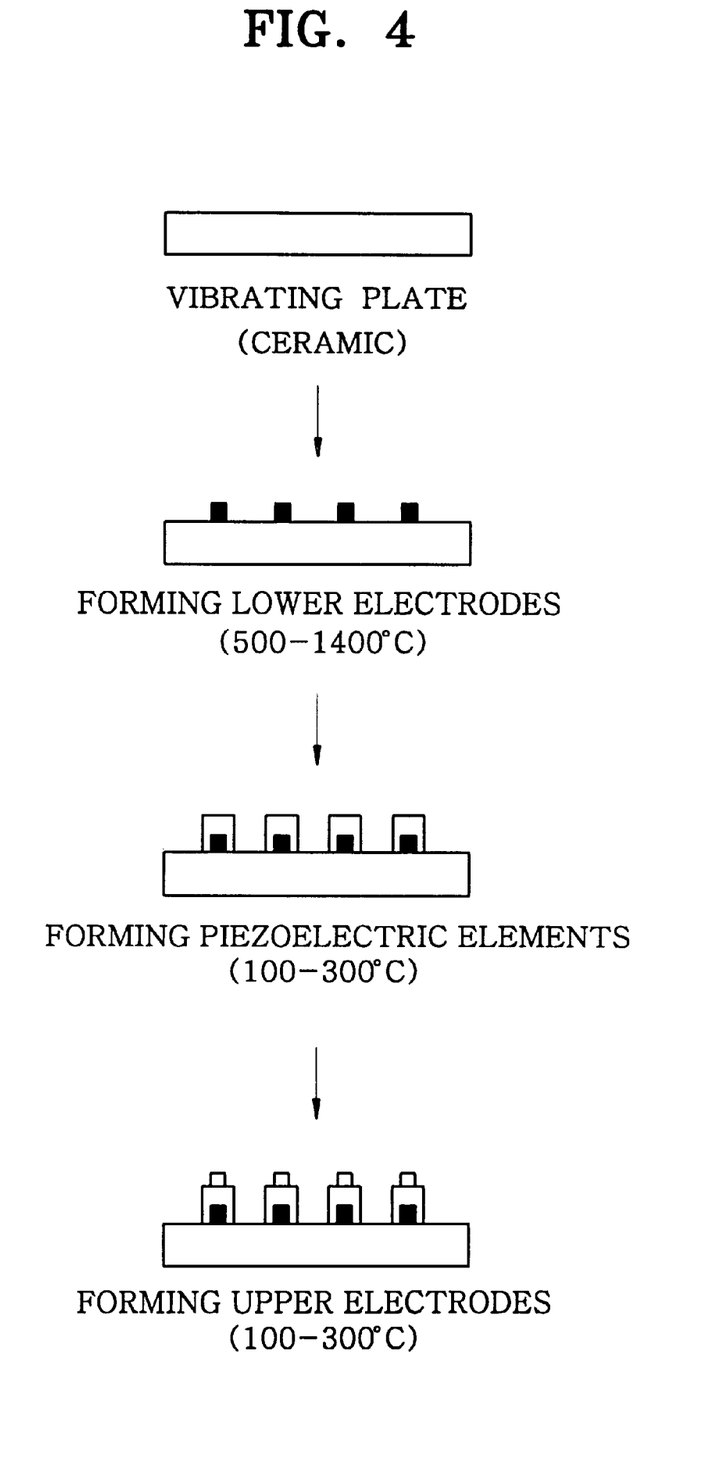
FIG. 4 is a flow chart illustrating a method for fabricating a piezoelectric/electrostrictive actuator, in the present invention, in association with the case in which a vibrating plate is made of ceramic.
Figure 5:
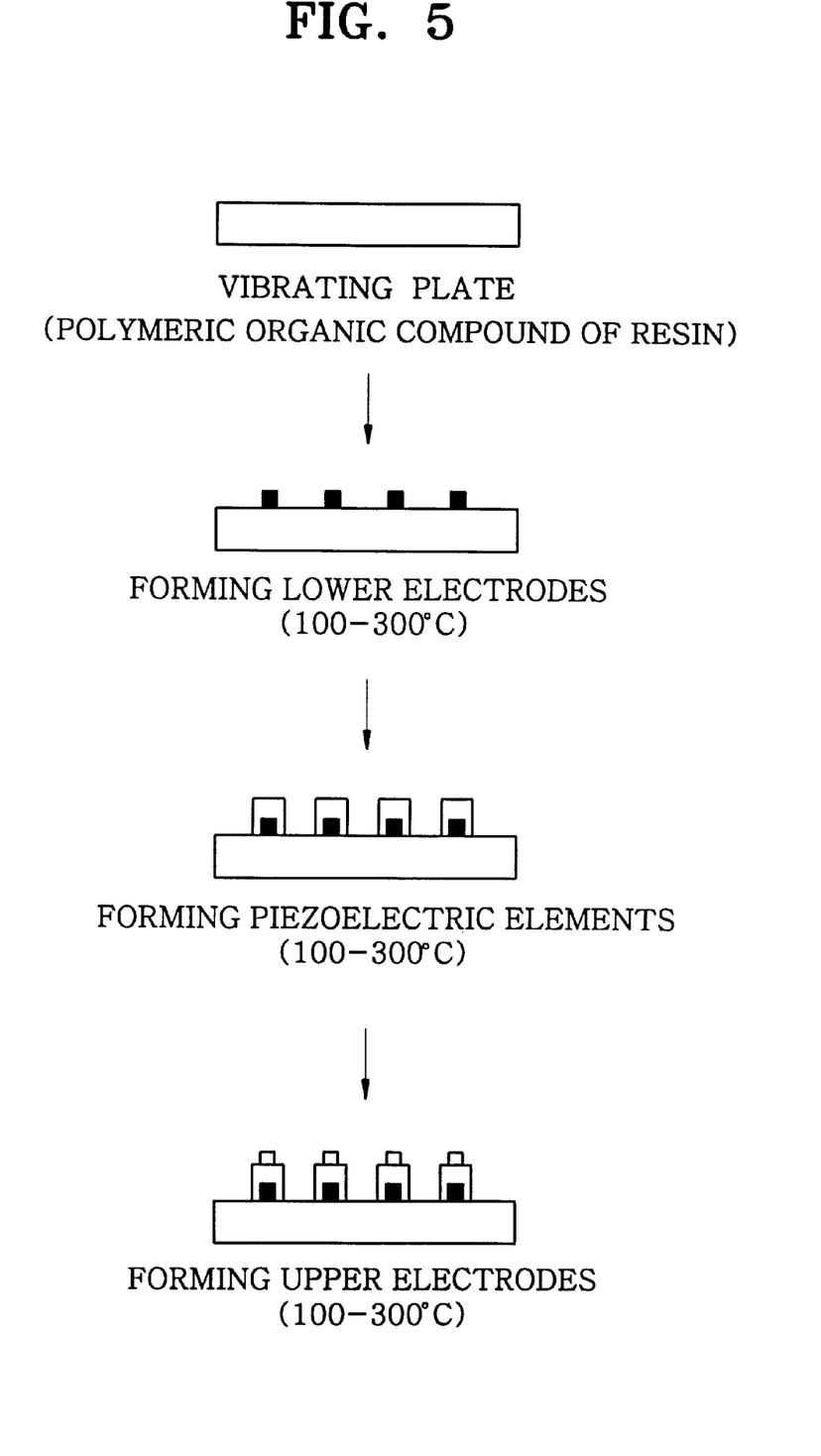
FIG. 5 is a flow chart illustrating a method for fabricating a piezoelectric/electrostrictive actuator, in the present invention, in association with the case in which a vibrating plate is made of organic compound.

Now, a method for fabricating a piezoelectric/electrostrictive actuator will be described in association with the case in which a vibrating plate is comprised of ceramic plate or made of organic compound. This method is illustrated in FIG. 4.

For the ceramic plate, aluminum oxide ($Al_2O_3$), zirconium oxide ($ZrO_2$), silicon carbide (SiC), silicon nitride ($Si_3N_4$), silicon dioxide ($SiO_2$), or other glass-based materials may be used. The ceramic plate is prepared in a conventional manner by forming a slurry containing an oxide power into a green sheet, and sintering the green sheet. Alternatively, the slurry may be shaped into a desired shape for the vibrating plate, and then sintered.

In this case, a separate lower electrode should be formed because the ceramic vibrating plate has no conductivity.

Where the vibrating plate is made of ceramic, the lower electrode is formed using conductive paste made of platinum, silver, silver/palladium (Ag/Pd)alloy, nickel, or copper. In this case, the formation of the lower electrode is achieved by coating conductive paste of, for example, platinum, on the ceramic vibrating plate, and thermally treating the resulting structure at a temperature of 500 to 1,400° C., preferably, 600 to 1,200° C., thereby forming a lower electrode while bonding the lower electrode to the ceramic vibrating plate.

For the resin vibrating plate, polyester, polyimide, and Teflon-based polymeric organic compounds may be used. In this case, the vibrating plate preferably has a thickness of 7 to 50 $\mu$m. Typically, the vibrating plate has a film structure.

In the case using the vibrating plate made of an organic compound, it is required to form a separate lower electrode because the organic compound has no conductivity.

Where the vibrating plate is made of an organic compound, the lower electrode is formed using conductive paste made of silver, aluminum, gold, nickel or platinum. In this case, the formation of the lower electrode is achieved by coating paste, for example, silver paste, which may be commercially available and adapted to be subjected to a low temperature treatment, on a vibrating plate by a printing method such as a screen printing or stencil printing method. Where the lower electrode is made of aluminum, gold, nickel or platinum, it is formed using a sputtering, vacuum deposition, or evaporation method.

After the formation of the lower electrode on the organic compound vibrating plate, the resulting structure is thermally treated at a temperature of 100 to 300°, preferably, 150 to 300° C., so that the lower electrode is bonded to the vibrating plate.

Thereafter, a piezoelectric/electrostrictive film is formed over the lower electrode bonded to the ceramic or polymeric compound vibrating plate. The resulting structure is then thermally treated at a temperature of 100 to 300°, preferably, 150 to 300° C., so that the piezoelectric/electrostrictive film is bonded to the lower electrode.

The formation of the piezoelectric/electrostrictive film and the bonding of the same film to the lower electrode using a thermal treatment are the same as those in the case using a metal vibrating plate.

Subsequently, an upper electrode is formed over the piezoelectric/electrostrictive film. For the upper electrode, silver, aluminum, gold, nickel, or platinum may be used.

The formation of the upper electrode is achieved in the same manner as in the case using a metal vibrating plate. For instance, the formation of the upper electrode is carried out by coating a film made of sliver, aluminum, gold, nickel, or platinum over the piezoelectric/electrostrictive film in such a fashion that the film is bonded to the piezoelectric/electrostrictive film. For a more strong bonding, the resulting structure may be additionally subjected to a thermal treatment at a temperature of 100 to 600° C.

An oxide film may be formed on the metal surface of the vibrating plate during the thermal treatments carried out in the fabrication of the piezoelectric/electrostrictive actuator. Otherwise, there may be a residue of the mold material. In such a case, the oxide film or residual mold material serves as an electrical insulating film for preventing upper and lower electrodes from being conducted with each other.

The present invention will now be described in detail with reference to the following examples, but the present invention is not to be construed as being limited thereto.

EXAMPLE 1

Ceramic paste, which was prepared using PZT (52/48) powder having a mean grain size of 50 nm, was printed on an SUS 316L vibrating plate having a thickness of 10 $\mu$m, by use of a screen with a micro pattern.

Samples of the resulting structure were subjected to a thermal treatment in air for 2 hours at 130° C., 300° C., and 600° C., respectively. In the sample thermally treated at 600° C., portions of the SUS vibrating plate printed with no ceramic paste were oxidized, so that they served as an insulating film.

In order to form upper electrodes, conductive paste was printed on each sample, and then dried at 100° C. Thus, piezoelectric/electrostrictive actuators were produced.

EXAMPLE 2

Ceramic paste, which was prepared using PZT (52/48) powder having a mean grain size of 50 nm, was printed on an aluminum oxide vibrating plate having a thickness of 8 $\mu$m and formed at its upper surface with a silver film for lower electrodes, by use of a screen with a micro pattern.

Samples of the resulting structure were subjected to a thermal treatment in air for 2 hours at 300° C., respectively. In order to form upper electrodes, silver paste was printed on each sample, and then thermally treated at 300° C. Thus, piezoelectric/electrostrictive actuators were produced.

EXAMPLE 3

Ceramic paste, which was prepared using PZT/PMN (60/40) powder, was printed on a nickel vibrating plate having a thickness of 10 $\mu$m, by use of a screen with a micro pattern.

Samples of the resulting structure were subjected to a thermal treatment in air for 2 hours at 300° C. In order to form upper electrodes, an aluminum film was deposited in vacuum on each sample. Thus, piezoelectric/electrostrictive actuators were produced.

EXAMPLE 4

A mold was formed over a nickel vibrating plate having a thickness of 10 $\mu$m using a photoresist film. Ceramic paste, which was prepared using PZT/PMN (60/40) powder, was filled in the mold.

Samples of the resulting structure were subjected to a thermal treatment in air for 2 hours at 200° C. After this thermal treatment, the photoresist film, which was used as the mold, was still left, so that it served as an insulating film.

In order to form upper electrodes, an aluminum film was deposited in vacuum on each sample. Thus, piezoelectric/electrostrictive actuators were produced.

EXAMPLE 5

A bonding dry film was attached to a polyester film having a thickness of 12 $\mu$m. A chamber plate, which was formed to have a micro pattern by etching an SUS plate, was then laid on the polyester film attached with the bonding dry film. The resulting structure was then subjected to a thermal treatment at 180° C. for 30 minutes, so that the chamber plate was bonded to the polyester film. During the thermal treatment, a uniform mass was applied in order to achieve a uniform bonding.

In order to remove portions of the bonding dry film respectively disposed at regions other than the regions where the polyester film serving as a vibrating plate was in contact with the chamber plate, the resulting structure was dipped in a mixed solution of sulphuric acid/nitric acid/hydrogen peroxide, thereby causing the bonding dry film to be etched. The resulting structure was then rinsed using distilled water.

An aluminum layer was then deposited on the polyester film opposite to the chamber plate by an evaporation method, thereby forming lower electrodes.

Thereafter, ceramic paste, which was prepared using PZT (52/48) powder, was printed on the lower electrodes by a screen printing method, thereby forming piezoelectric/electrostrictive films. The resulting structure was then subjected to a thermal treatment at 150° C. for 2 hours.

Gold was then sputtered on the piezoelectric/electrostrictive films, thereby forming upper electrodes. Thus, piezoelectric/electrostrictive actuators were produced.

EXAMPLE 6

A bonding dry film was attached to a polyester film having a thickness of 10 µm. A chamber plate, which was formed to have a micro pattern by etching an SUS plate, was then laid on the polyester film attached with the bonding dry film. The resulting structure was then subjected to a thermal treatment at 200° C. for 2 hours, so that the chamber plate was bonded to the polyester film. During the thermal treatment, a uniform mass was applied in order to achieve a uniform bonding.

The resulting structure was then dipped in a mixed solution of sulphuric acid/nitric acid/hydrogen peroxide, thereby causing the bonding dry film to be etched at exposed portions thereof. The resulting structure was then rinsed using distilled water.

Gold was then sputtered on the polyester film opposite to the chamber plate, thereby forming lower electrodes. Thereafter, ceramic paste, which was prepared using PZT/PMN (60/40) powder, was screen printed on the lower electrodes, thereby forming piezoelectric/electrostrictive films. The resulting structure was then subjected to a thermal treatment at 200° C. for 2 hours.

Aluminum was then deposited on the piezoelectric/electrostrictive films, thereby forming upper electrodes. Thus, piezoelectric/electrostrictive actuators were produced.

EXAMPLE 7

A bonding dry film was attached to an SUS thin plate having a thickness of 15 µm. A chamber plate, which was formed to have a micro pattern by etching an SUS plate, was then laid on the SUS thin plate attached with the bonding dry film. The resulting structure was then subjected to a thermal treatment at 200° C. for 2 hours, so that the chamber plate was bonded to the SUS thin plate. During the thermal treatment, a uniform mass was applied in order to achieve a uniform bonding.

The resulting structure was then dipped in a mixed solution of sulphuric acid/nitric acid/hydrogen peroxide, thereby causing the bonding dry film to be etched at exposed portions thereof. The resulting structure was then rinsed using distilled water.

A mold having a micro pattern was then formed on the SUS thin plate opposite to the chamber plate by use of a photoresist film. Ceramic paste, which was prepared using PZT (52/48) powder, was then filled in the mold, thereby forming piezoelectric/electrostrictive films. The resulting structure was then subjected to a thermal treatment at 300° C. for 2 hours.

Silver paste was then applied to the piezoelectric/electrostrictive films, thereby forming upper electrodes. Thus, piezoelectric/electrostrictive actuators were produced.

As apparent from the above description, in the present invention, a piezoelectric/electrostrictive thin or thick film is directly formed on a vibrating plate made of metal or organic compound without using bonding and slicing processes. Accordingly, the fabrication of piezoelectric/electrostrictive actuators is simplified, thereby achieving a great improvement in product quality and productivity.

In the present invention, the fabrication of piezoelectric elements is achieved at a temperature considerably lower than that in the conventional cases using ceramic vibrating plate and involving a high temperature sintering process. Accordingly, a wider range of materials for the vibrating plate can be used. It is also possible to minimize a variation in the shape and properties of the vibrating plate, thereby achieving an improvement in yield. Since the piezoelectric/electrostrictive film can be patterned during its formation, it is possible to simultaneously form a desired number of piezoelectric/electrostrictive actuators.

Where the vibrating plate is made of metal, it is possible to eliminate the process for forming lower electrodes. In the present invention, an oxide film, which is formed after a thermal treatment for the piezoelectric/electrostrictive film, or a photoresist film, which is left after being used as a mold upon forming ceramic pattern, serves as an electrical insulating film. Accordingly, it is possible to prevent upper and electrodes from being conducted with each other.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for producing a piezoelectric/electrostrictive actuator comprising the steps of:

preparing a vibrating plate made of metal;

preparing ceramic oxide powder having a grain size of 5 µm or less and containing lead (Pb) and titanium (Ti) as basic elements thereof, said ceramic oxide powder being produced by a non-explosive oxidative-reductive combustion reaction carried out at a temperature of 100 to 500° C., preparing an organic solvent or water-based ceramic sol solution containing constituent ceramic elements identical or similar to those of said ceramic oxide powder, and mixing said ceramic oxide powder with said organic solvent or water-based ceramic sol solution, thereby producing ceramic paste;

applying a piezoelectric/electrostrictive film of a thickness in a range below 100 µm on said vibrating plate using said ceramic paste;

thermally treating the resulting structure obtained after the formation of said piezoelectric/electrostrictive film at a temperature in a range below 300° C., to bake said piezoelectric/electrostrictive film to the thickness applied on said vibrating plate all at once; and forming an upper electrode on said piezoelectric/electrostrictive film.

2. The method of claim 1, further comprising the step of thermally treating the structure obtained after the formation of said upper electrode at a temperature of 100 to 300° C.

3. The method claim 1, wherein said metal vibrating plate is a stainless steel or nickel plate.

4. The method of claim 1, wherein said ceramic oxide powder is PZT, PMN or their solid solution (PZT-PMN) complex oxide.

5. The method of claim 4, wherein said ceramic oxide further includes one or more element among nickel (Ni), lantanum (La), barium (Ba), zinc (Zn), lithium (Li), cobalt (Co), cadmium (Cd), cerium (Ce), chroma (Cr), antimony (Sb), iron (Fe), yttrium (Y), tantalum (Ta), tungsten (W), strontium (Sr), calcium (Ca), bismuth (Bi), tin (Sn) manganese (Mn).

6. The method of claim 1, wherein the thickness of said piezoelectric/electrostrictive film is 1–100 μm.

7. The method of claim 6, wherein the thickness of said piezoelectric/electrostrictive film is 5–30 μm.

8. The method of claim 1, wherein the thermal treatment after the formation of said piezoelectric/electrostrictive film is carried out at a temperature of 150 to 300° C.

9. The method of claim 1, wherein said upper electrode is made of a seed material from the group consisting of silver (Ag), aluminum (Al), gold (Au), nickel (Ni), and platinum (Pt).

10. A method for producing a piezoelectric/electrostrictive actuator comprising the steps of:

preparing a vibrating plate;

forming a lower electrode on said vibrating plate;

preparing ceramic oxide powder having a grain size of 5 μm or less and containing lead (Pb) and titanium (Ti) as basic elements thereof, said ceramic oxide powder being produced by a non-explosive oxidative-reductive combustion reaction carried out at a temperature of 100 to 500° C., preparing an organic solvent or water-based ceramic sol solution containing constituent ceramic elements identical or similar to those of said ceramic oxide powder, and mixing said ceramic oxide powder with said organic solvent or water-based ceramic sol solution, thereby producing ceramic paste;

applying a piezoelectric/electrostrictive film of a thickness in a range below 100 μm on said lower electrode using said ceramic paste;

thermally treating the resulting structure obtained after the formation of said piezoelectric/electrostrictive film at a temperature in a range below 300° C., to bake said piezoelectric/electrostrictive film to the thickness applied on said vibrating plate all at once; and forming an upper electrode on said piezoelectric/electrostrictive film.

11. The method of claim 10, wherein said vibrating plate is ceramic vibrating plate.

12. The method of claim 10, wherein said ceramic vibrating plate is made of ceramic material selected from the group consisting of aluminum oxide (Al2O3), zirconium oxide (ZrO2), silicon carbide (Sic), silicon nitride (Si3N4, silicon dioxide (SiO2), and a glass-based material.

13. The method of claim 10, wherein said lower electrode is made of a material selected from the group consisting of platinum (Pt), silver (Ag), silver/palladium (Ag/Pd) alloy.

14. The method of claim 13, further comprising the step of thermally treating the structure obtained after the formation of said lower electrode at a temperature of 500 to 1,400° C.

15. The method of claim 10, wherein said vibrating plate is made of a polymeric organic compound.

16. The method of claim 15, wherein said polymeric organic compound is selected from the group consisting of polyester-based resin, polyimide-resin, and Teflon-based resin.

17. The method of claim 16, wherein said lower electrode is made of a material selected from the group consisting of silver (Ag), aluminum (Al), gold (Au), nickel (Ni), and platinum (Pt).

18. The method of claim 17, further comprising the step of thermally treating the structure obtained after the formation of said lower electrode at a temperature of 100 to 300° C.

19. The method of claim 10, wherein said ceramic oxide powder is PZT, PMN or their solid solution (PZT-PMN) complex oxide.

20. The method of claim 19, wherein said ceramic oxide further includes one or more element among nickel (Ni), lantanum (La), barium (Ba), zinc (Zn), lithium (Li), cobalt (Co), cadmium (Cd), cerium (Ce), chrome (Cr), antimony (Sb), iron (Fc), yttrium (Y), tantalum (Ta), tungsten (W), strontium (Sr), calcium (Ca), bismuth (Bi), Tin (Sn), manganese (Mn).

21. The method of claim 10, wherein the thickness of said piezoelectric/electrostrictive film is 1–100 μm.

22. The method of claim 21, wherein the thickness of said piezoelectric/electrostrictive film is 5–30 μm.

23. The method of claim 10, wherein said upper electrode is made of a material selected from the group consisting of silver (Ag), aluminum (Al), gold (Au), nickel (Ni), and platinum (Pt).

24. The method of claim 10, further comprising the step of thermally treating the structure obtained after the formation of said upper electrode at a temperature of 100 to 300° C.

25. The method of claim 10, wherein the thermal treatment after the formation of said piezoelectric/electrostrictive film is carried out at a temperature of 150 to 300° C.

* * * * *